United States Patent
Gawai et al.

(10) Patent No.: US 11,574,842 B2
(45) Date of Patent: Feb. 7, 2023

(54) METHODS FOR FORMING CONDUCTIVE VIAS, AND ASSOCIATED DEVICES AND SYSTEMS

(71) Applicant: Micron Technology, Inc., Boise, ID (US)

(72) Inventors: Trupti D. Gawai, Boise, ID (US); David A. Kewley, Boise, ID (US); Aaron M. Lowe, Cork (IE); Radhakrishna Kotti, Meridian, ID (US); David S. Pratt, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 17/230,833

(22) Filed: Apr. 14, 2021

(65) Prior Publication Data
US 2022/0336277 A1  Oct. 20, 2022

(51) Int. Cl.
*H01L 21/768* (2006.01)
*H01L 23/535* (2006.01)

(52) U.S. Cl.
CPC .. *H01L 21/76895* (2013.01); *H01L 21/76805* (2013.01); *H01L 23/535* (2013.01)

(58) Field of Classification Search
CPC ......... H01L 21/76895; H01L 21/76805; H01L 23/535
See application file for complete search history.

(56) References Cited

U.S. PATENT DOCUMENTS 5,472,912 A * 12/1995 Miller ............... H01L 21/76877
438/626
10,283,548 B1   5/2019 Ku et al.
(Continued)

FOREIGN PATENT DOCUMENTS

JP    2017037929 A    2/2017
KR   20080069811 A    7/2008
(Continued)

OTHER PUBLICATIONS

International Search Report and Written Opinion dated Feb. 23, 2022 for International Patent Application No. PCT/US2021/058482, 9 pages.
(Continued)

*Primary Examiner* — Shahed Ahmed
*Assistant Examiner* — Vicki B. Booker
(74) *Attorney, Agent, or Firm* — Perkins Coie LLP

(57) ABSTRACT

Methods of manufacturing semiconductor devices, and associated systems and devices, are disclosed herein. In some embodiments, a method of manufacturing a semiconductor device includes forming an opening in an insulative material at least partially over an electrically conductive feature. The method can further include forming a ring of electrically non-conductive material extending at least partially about a sidewall of the insulative material that defines the opening. The method can further include removing a portion of the ring to form an opening over the electrically conductive feature, and then depositing an electrically conductive material into the opening in the ring to form a conductive via electrically coupled to the electrically conductive feature.

14 Claims, 11 Drawing Sheets

(56) References Cited

U.S. PATENT DOCUMENTS

| | | |
|---|---|---|
| 2004/0198036 A1 | 10/2004 | Nakamura |
| 2011/0139497 A1 | 6/2011 | Li et al. |
| 2011/0171827 A1 | 7/2011 | Farooq et al. |
| 2014/0070426 A1 | 3/2014 | Park et al. |
| 2016/0358859 A1 | 12/2016 | Murray et al. |
| 2019/0096833 A1 | 3/2019 | Lim et al. |

FOREIGN PATENT DOCUMENTS

| | | |
|---|---|---|
| KR | 20190015097 A | 2/2019 |
| TW | 202038383 A | 10/2020 |

OTHER PUBLICATIONS

Office Action dated Jun. 29, 2022 for Taiwanese Patent Application No. 110143648, 9 pages (with translation).

\* cited by examiner

METHODS FOR FORMING CONDUCTIVE VIAS, AND ASSOCIATED DEVICES AND SYSTEMS

TECHNICAL FIELD

The present technology generally relates to semiconductor devices and methods for manufacturing semiconductor devices, and more particularly relates to methods for forming conductive vias in a semiconductor device.

BACKGROUND

Memory devices are widely used to store information related to various electronic devices such as computers, wireless communication devices, cameras, digital displays, and the like. Information is stored by programing different states of a memory cell. Various types of memory devices exist, such as non-volatile memory devices (e.g., NAND Flash memory devices) and volatile memory devices (e.g., dynamic RAM (DRAM), synchronous dynamic RAM (SDRAM), and the like).

Improving memory devices, generally, may include increasing memory cell density, increasing read/write speeds or otherwise reducing operational latency, increasing reliability, increasing data retention, reducing power consumption, or reducing manufacturing costs, among other metrics. One way of reducing manufacturing costs is to improve manufacturing processes to increase the margin of successfully manufactured devices. Manufacturers can improve the manufacturing margin by implementing processes that, for example, increase the consistency or tolerance off manufacturing steps (e.g., removal or deposition of materials), improve the scale of manufacturing, and so on.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
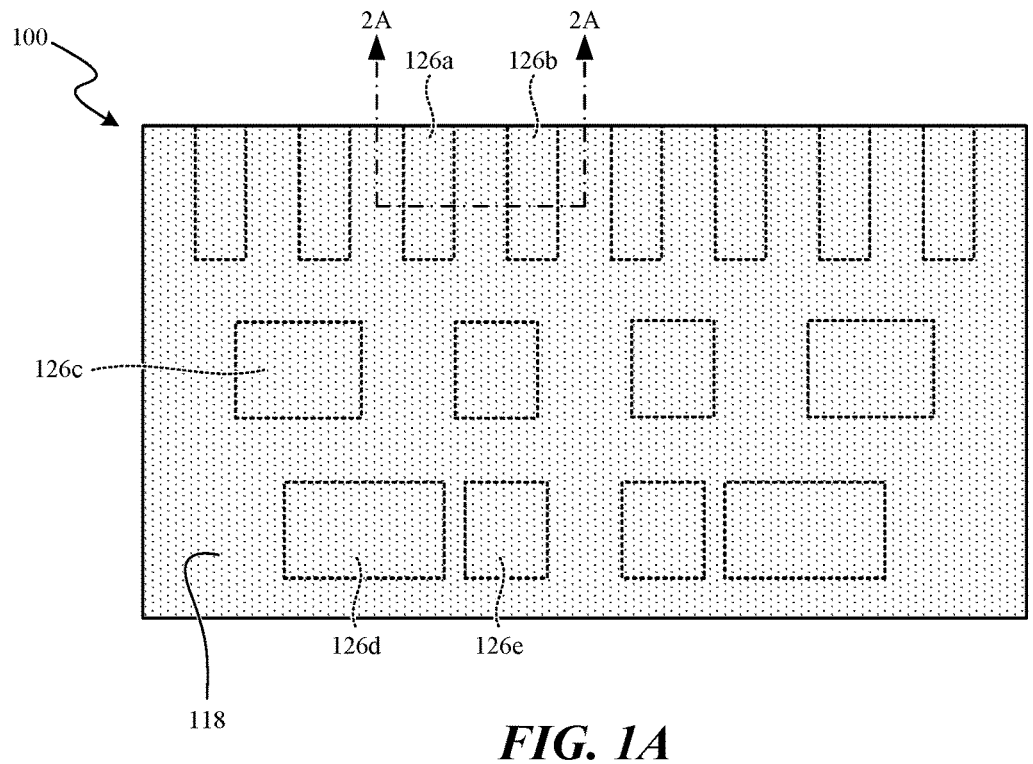
FIGS. 1A-1G are enlarged partially-schematic top views illustrating various stages in a method of manufacturing a semiconductor device in accordance with embodiments of the present technology.

Embodiments of the present technology include methods of manufacturing semiconductor devices, such as memory devices, and associated devices and systems. In several of the embodiments described below, for example, a method of manufacturing a semiconductor device includes forming an opening (e.g., a trench) in an electrically insulative material at least partially over a first electrically conductive feature and a second electrically conductive feature. The first and second electrically conductive features can be metal lines, such as word and/or bit lines of a memory device. The electrically insulative material can include a sidewall at least partially defining the opening. The method can further include forming a ring of electrically non-conductive material on/about the sidewall of the insulative material. In some embodiments, the ring can have a generally rectilinear shape. The method can further include removing a first portion of the ring to form a first opening over the first electrically conductive feature and removing a second portion of the ring to form a second opening over the second electrically conductive feature. Finally, a conductive material can be deposited into the first and second openings to form first and second electrically conductive vias on the first and second electrically conductive features, respectively.

In some aspects of the present technology, the conductive via portions can be formed at a lower cost and/or with higher margin than conventional techniques for forming conductive vias. For example, the opening formed in the insulative material can be significantly larger (e.g., having a lower aspect ratio) than the subsequently formed conductive vias. Accordingly, the opening can be formed via an etching or other process that is less precise—and thus more reliable and lower cost—than conventional methods that etch high aspect ratio holes that correspond to the subsequent dimensions of the conductive vias formed therein. Moreover, forming the ring allows the first and second portions of the ring—which can have dimensions that correspond to the dimensions of the subsequently-formed conductive vias—to be precisely removed using a selective-etching process.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-5. For example, some details of memory devices well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1A-5.

FIGS. 1A-1G are enlarged partially-schematic top views illustrating various stages in a method of manufacturing a semiconductor device 100 (e.g., a memory device) in accordance with embodiments of the present technology. FIGS. 2A-2G are enlarged side cross-sectional views of the semiconductor device 100 taken along the lines 2A-2A through 2G-2G shown in FIGS. 1A-1G, respectively, in accordance with embodiments of the present technology. Generally, the semiconductor device 100 can be manufactured, for example, as a discrete device or as part of a larger wafer or panel. In wafer-level or panel-level manufacturing, a larger structure is formed before being singulated to form a plurality of individual structures. For ease of explanation and understanding, FIGS. 1A-2G illustrate the fabrication of a portion of a single semiconductor device 100. However, one skilled in the art will readily understand that the fabrication of the semiconductor device 100 can be scaled to the wafer and/or panel level—that is, to include many more components so as to be capable of being singulated into two or more semiconductor devices—while including similar features and using similar processes as described herein.

Figure 2A:
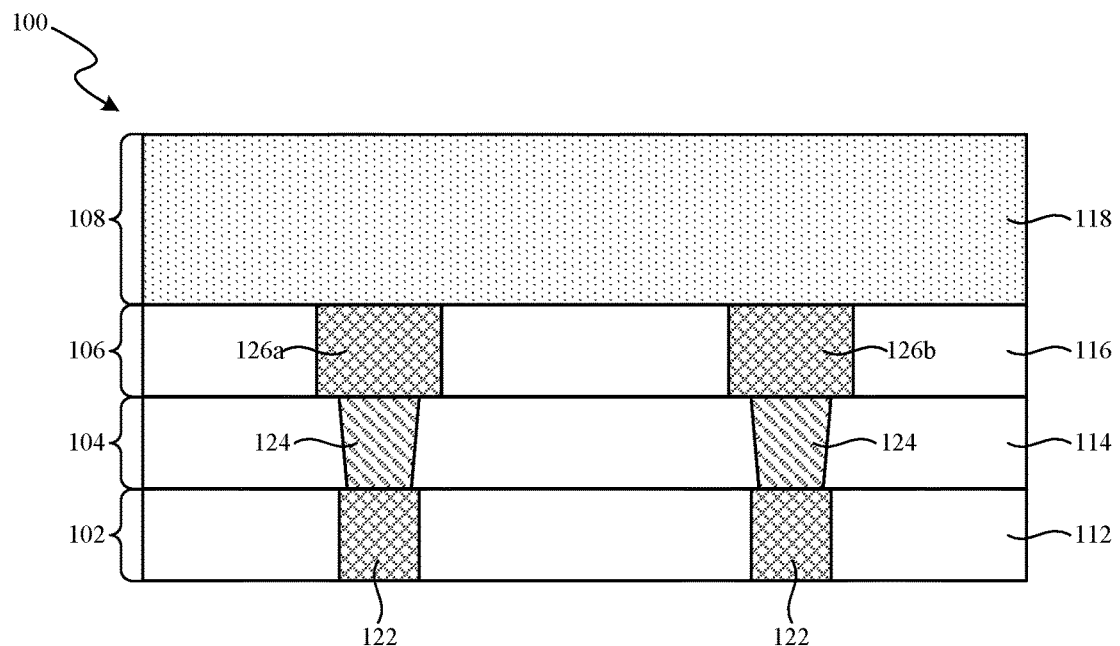
FIGS. 2A-2G are enlarged side cross-sectional views of the semiconductor device of FIGS. 1A-1G taken along the lines 2A-2A through 2G-2G shown in FIGS. 1A-1G, respectively, in accordance with embodiments of the present technology.

FIGS. 1A and 2A illustrate the semiconductor device 100 after formation of (i) a first layer 102 including a first insulative material 112 and first conductive features 122 (e.g., a first metallization layer), (ii) a second layer 104 over the first layer 102 and including a second insulative material 114 and conductive vias 124 electrically coupled/connected to corresponding ones of the first conductive features 122, (iii) a third layer 106 over the second layer 104 and including a third insulative material 116 and second conductive features 126 (e.g., a second metallization layer including individually identified first through fifth ones of the second conductive features 126a-126e, respectively) electrically coupled/connected to corresponding ones of the conductive vias 124, and (iv) a fourth layer 108 over the third layer 106 and including a fourth insulative material 118. The second conductive features 126 are fully or partially obscured in FIGS. 1A-1G and therefore shown at least partially schematically.

The first through fourth insulative materials 112-118 (collectively "insulative materials 112-118") can comprise one or more electrically-insulative materials such as a passivation material, dielectric material, oxide (e.g., silicon oxide), and/or tetraethyl orthosilicate (TEOS), and the insulative materials 112-118 can be the same or different. In some embodiments, the fourth insulative material 118 comprises TEOS and has a thickness of between about 2000-5000 angstroms (e.g., about 3500 angstroms). The thicknesses of the first through fourth layers 102-108 (collectively "layers 102-108") can be the same or different. The first conductive features 122, the conductive vias 124, and the second conductive features 126 can comprise a metal such as tungsten, a metal alloy, and/or a conductive-metal containing material, and can have the same or varying dimensions (e.g., widths, diameters) and/or arrangements. In some embodiments, the first conductive features 122 comprise copper and the second conductive features 126 comprise tungsten.

The first conductive features 122 can be electrically coupled to one or more circuit elements (e.g., wires, traces, interconnects, transistors; not shown) that can be formed in/on a substrate (not shown). The circuit elements can include, for example, memory circuits (e.g., dynamic random memory (DRAM) or other type of memory circuits), controller circuits (e.g., DRAM controller circuits), logic circuits, and/or other circuits. In some embodiments, the first conductive features 122 are electrically coupled to one or more complementary metal-oxide-semiconductor (CMOS) circuits.

The second conductive features 126 can be metal lines, contacts, traces, or the like extending through/along the third layer 106. In some embodiments, for example, the second conductive features 126 can be word lines and/or bit lines electrically coupled to one or memory elements (not shown). As best seen in FIG. 1A, the second conductive features 126 can have different planform shapes and/or dimensions. In the illustrated embodiment, for example, each of the second conductive features 126 have a rectangular shape. However, in the illustrated embodiment the first and second ones of the second conductive features 126a-b have the same dimensions, while the third one of the second conductive features 126c, the fourth one of the second conductive features 126d, the fifth one of the second conductive features 126e, and so on have different dimensions. In the illustrated embodiment, the second conductive features 126 are generally arranged in rows. In other embodiments, the second conductive features 126 can have different shapes (e.g., circular, rectilinear, polygonal, irregular), different sizes, and/or can be arranged differently (e.g., in more or fewer rows, irregularly, in a grid, spaced closer or farther apart from one another).

Figure 1B:
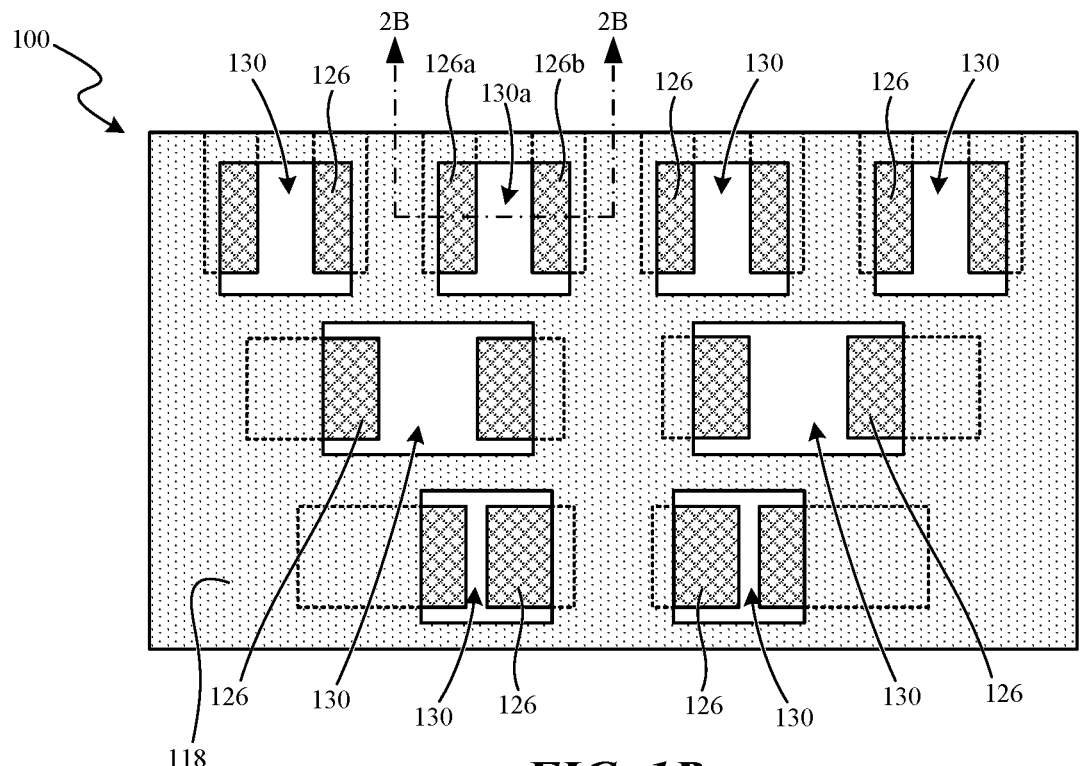
Figure 2B:
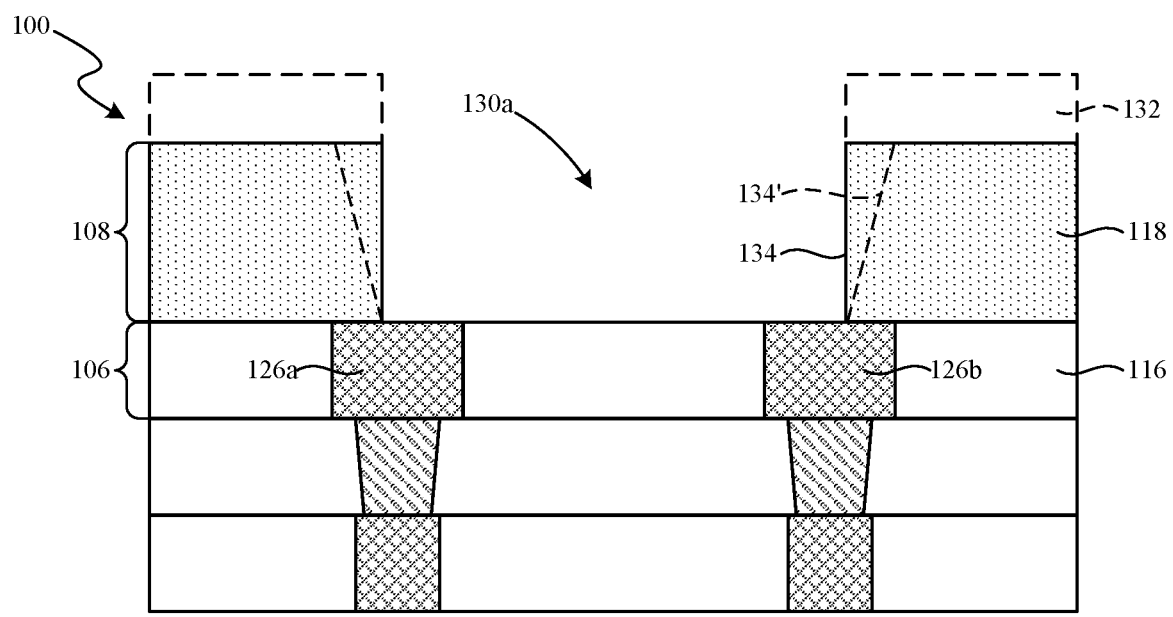

FIGS. 1B and 2B illustrate the semiconductor device 100 after forming openings 130 (e.g., including an individually identified first opening 130a) through the fourth insulative material 118 of the fourth layer 108 to expose a portion of two or more of the second conductive features 126 in each of the openings 130. For example, a portion of the first one of the second conductive features 126a and a portion of the second one of the second conductive features 126b are exposed in the first opening 130a. A photolithography, etching, punching, chopping, masking, and/or other suitable process can be used to remove portions of the fourth insulative material 118 to form the openings 130. In some embodiments, one or more additional layers 132 (shown schematically in FIG. 2B) can optionally be formed over the fourth layer 108 before forming the openings 130. The additional layers 132 can comprise one or more resist, antireflective coating (ARC), backside antireflective coating (BARC), carbon, and/or other suitable layers known in the art of photolithography. In the illustrated embodiment, a portion of adjacent ones of the second conductive features 126 are exposed in corresponding ones of the openings 130. In other embodiments, some or all the openings 130 can be formed over (i) all or a portion of a single one of the second conductive features 126, (ii) the entire footprint (e.g., area, planform shape) of one or more of the second conductive features 126, (iii) more or less of the footprint of the second conductive features 126, (iv) more than two of the second conductive features 126, and/or (v) non-adjacent ones of the second conductive features 126.

Referring to FIG. 2B, in some embodiments the fourth insulative material 118 includes a generally vertical sidewall 134 at/defining each of the openings 130. In other embodiments, the sidewalls 134 can be angled/slanted (e.g., relative to an upper surface of the third layer 106) as shown in dashed lines in FIG. 2B and identified by reference numeral 134'. In such embodiments, the openings 130 can have a tapered shape including, for example, a cross-sectional dimension (e.g., radius, diameter, area) that decreases in a direction toward the third layer 106.

Figure 1C:
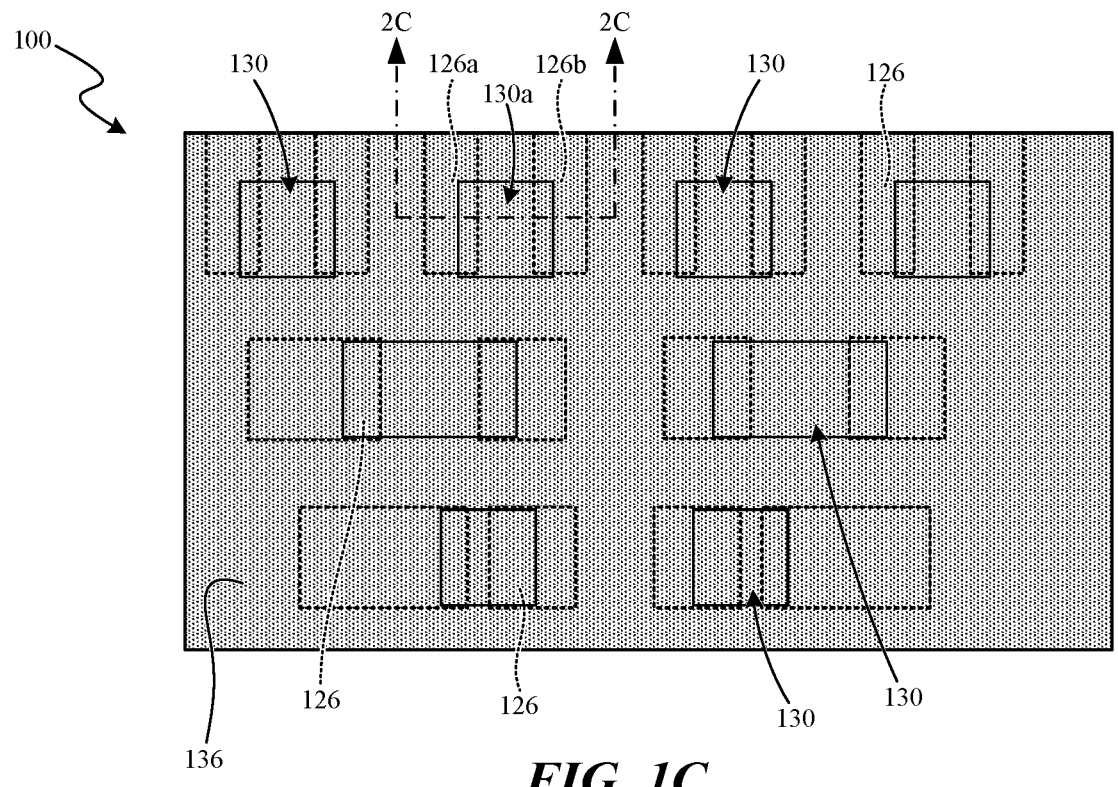
Figure 2C:
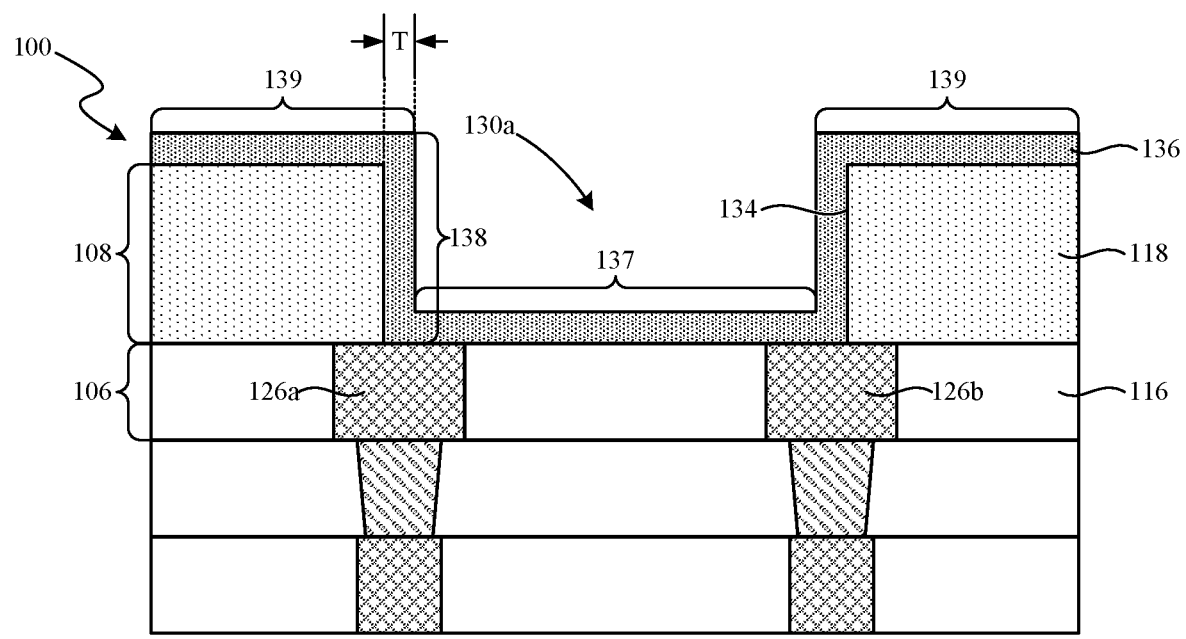

FIGS. 1C and 2C illustrate the semiconductor device 100 after forming/depositing (i) an electrically non-conductive liner 136 over the fourth insulative material 118 and in the openings 130 over the third layer 106. The non-conductive liner 136 can comprise a nitride, oxide, or other suitable electrically non-conductive material. Referring to FIG. 2C, the non-conductive liner 136 can include, in each of the openings 130, (i) a vertical portion 138 formed along the sidewall 134 of the opening 130 and (ii) a first horizontal portion 137 formed over the third layer 106 exposed in the opening 130 (e.g., over portions of the second conductive contacts 126 and the third insulative material 116 exposed in the openings 130). In some embodiments, the non-conductive liner 136 can further include a second horizontal portion 139 extending over the fourth insulative material 118 (e.g., an upper surface of the fourth insulative material 118). As described in detail below, portions of the vertical portions 138 of the non-conductive liner 136 can be selectively removed (e.g., etched) and filled to form individual conductive vias electrically coupled to the second conductive features 126 in the third layer 106. Accordingly, a thickness T of the non-conductive liner 136 can be selected based on a desired final dimension (e.g., thickness) of the conductive vias. In some embodiments, the thickness T can be less than 100 nanometers, less than 10 nanometers, less than 5 nanometers, less than 1 nanometer, or greater than 100 nanometers. Moreover, to facilitate the selective removal of the non-conductive liner 136, in some embodiments the non-conductive liner 136 can be formed of a material that is different than that of the fourth insulative material 118.

Figure 1D:
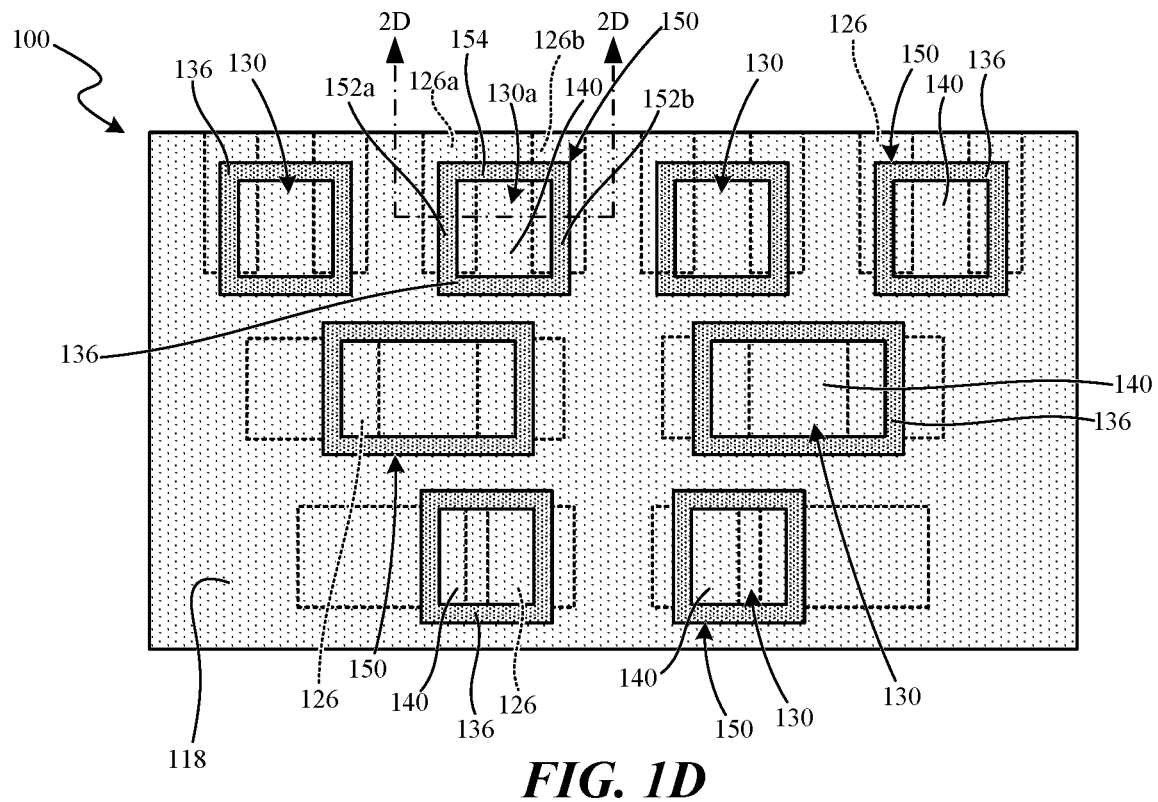
Figure 2D:
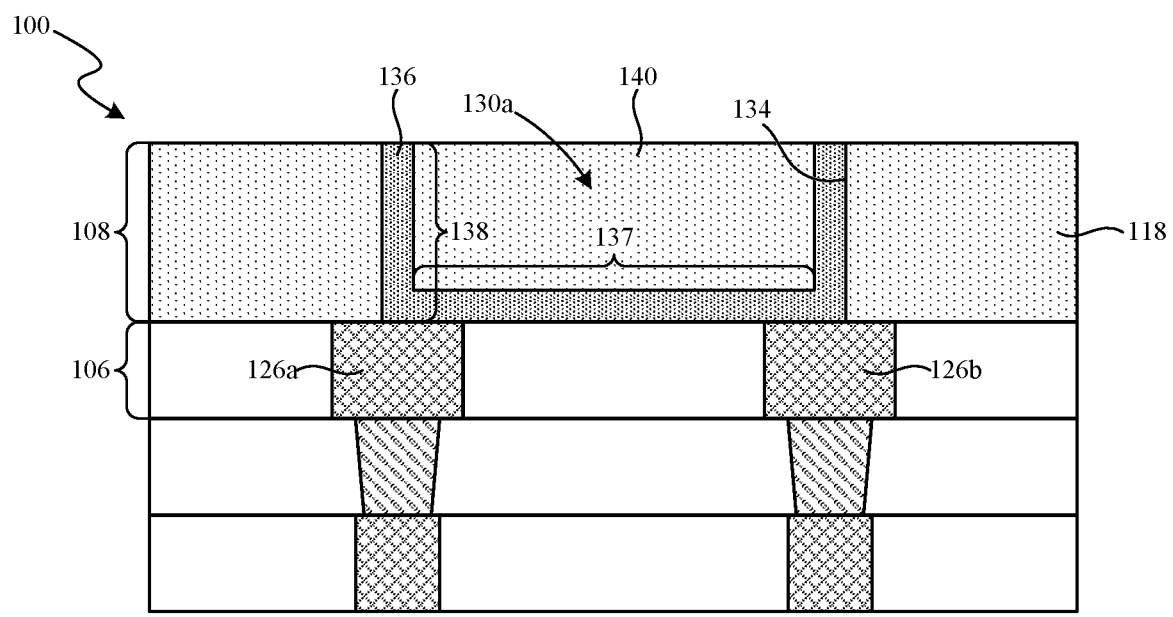

FIGS. 1D and 2D illustrate the semiconductor device 100 after depositing a fifth insulative material 140 in the openings 130 over the non-conductive liner 136. FIGS. 1D and 2D further illustrate the semiconductor device after removing (i) the second horizontal portion 139 (FIG. 2C) of the non-conductive liner 136 to leave only the vertical portions 138 and the first horizontal portions 137 in the openings 130 and (ii) any portion of the fifth insulative material 140 deposited over the fourth insulative material 118 (e.g., over the second horizontal portion 139 of the non-conductive liner 136). In some embodiments, a photolithography, punching, plasma etching, wet etching, and/or other suitable process can be used to remove the second horizontal portions 139 and any of the fifth insulative material 140 thereover. The fifth insulative material 140 can comprise an oxide, a photoresist material, carbon-based spin on material, and/or another electrically-insulative material. In some embodiments, the fifth insulative material 140 is a sacrificial material (e.g., an under layer) configured to be removed during subsequent downstream processing steps. In other embodiments, the fifth insulative material 140 is configured to remain in the semiconductor device 100 after manufacturing and therefore can be, for example, the same material as the fourth insulative material 118. The fifth insulative material 140 can be deposited via a spin-on process or another suitable deposition process.

As best seen in FIG. 1D, removing the second horizontal portion 139 of the non-conductive liner 136 can separate/disconnect the non-conductive liner 136 in each of the openings 130 such that the vertical portions 138 (FIG. 2D) of the non-conductive liner 136 form/define a plurality of rings 150 extending along/about the sidewalls 134 of corresponding ones of the openings 130. With reference to the ring 150 formed in the first opening 130a, the rings 150 can each include via portions 152 (e.g., first or vertical side or edge portions; identified individually as a first via portion 152a and a second via portion 152b) each positioned at least partially over a corresponding one of the second conductive features 126. Specifically, the first via portion 152a can be positioned at least partially over the first one of the second conductive features 126a and the second via portion 152b can be positioned at least partially over the second one of the second conductive features 126b. The rings 150 can further include connecting portions 154 (e.g., second or horizontal side or edge portions) extending between and connecting the via portions 152. In the illustrated embodiment, the rings 150 have a generally rectangular shape formed by the opposing via portions 152 and the opposing connecting portions 154. In other embodiments, the rings 150 can have other shapes (e.g., circular, polygonal, square, irregular) determined by, for example, the shape and dimensions of the openings 130.

Figure 1E:
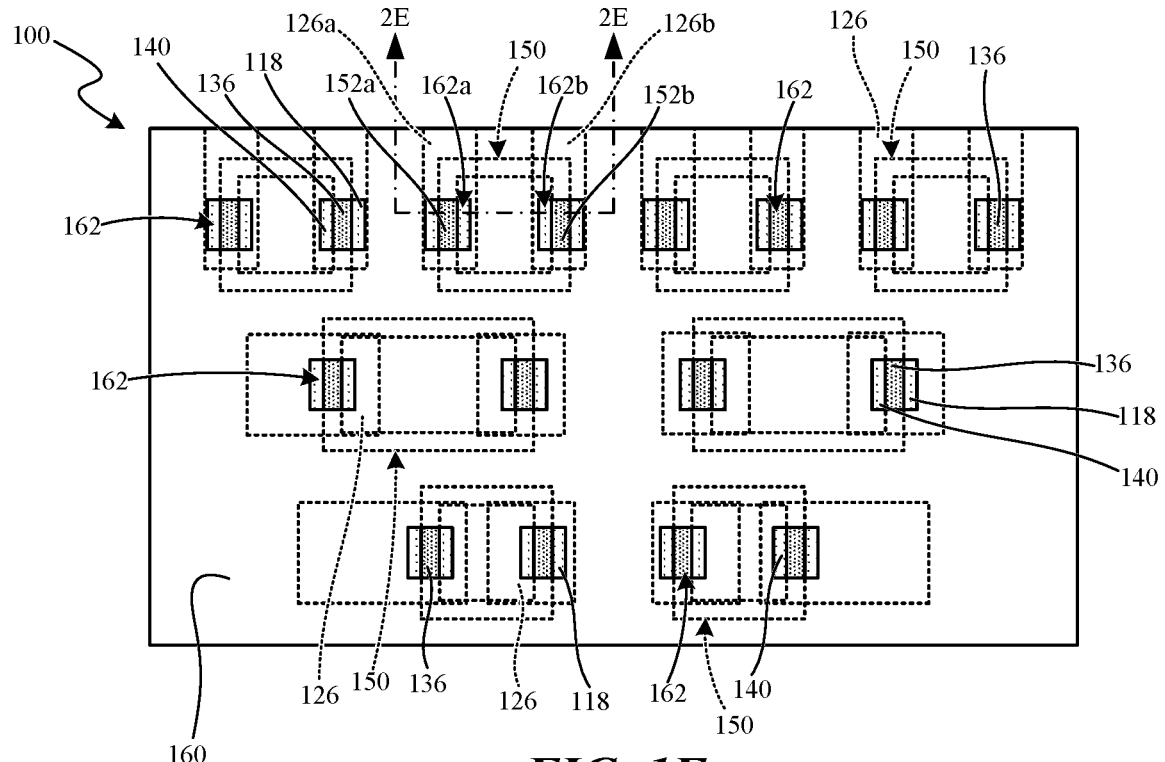
Figure 2E:
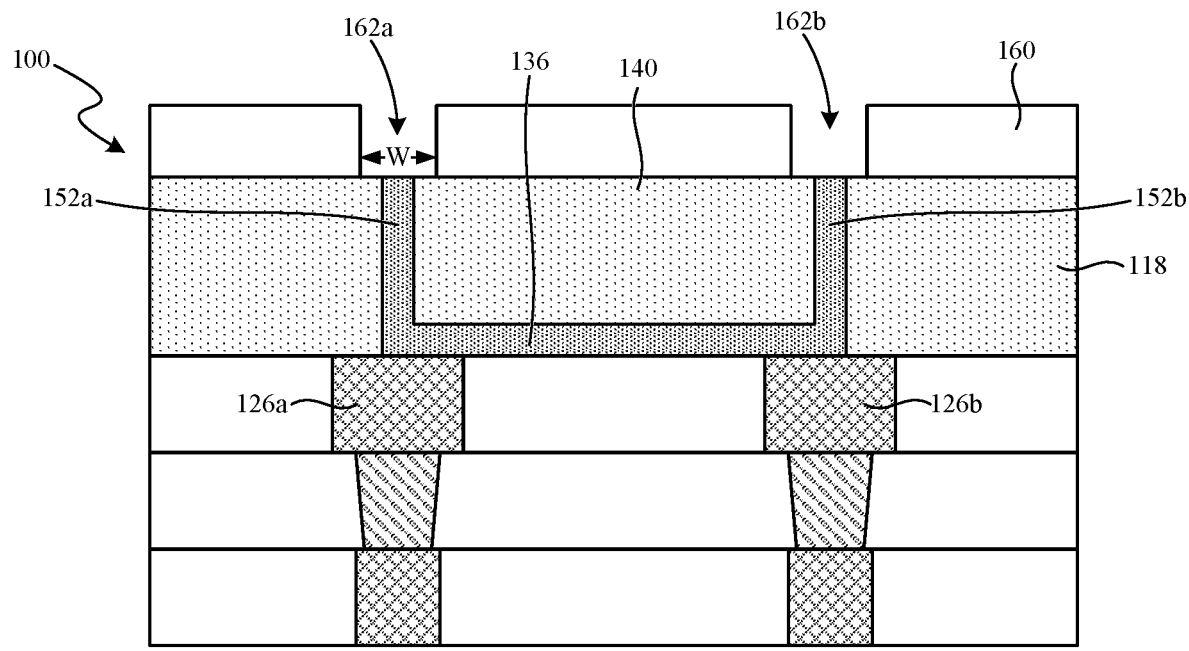

FIGS. 1E and 2E illustrate the semiconductor device 100 after forming a mask 160 over the upper surface of the semiconductor device 100 (e.g., formed by the fourth insulative material 118, the fifth insulative material 140, and/or the non-conductive liner 136). The mask 160 can be a photoresist or suitable photolithography mask. In the illustrated embodiment, the mask 160 includes a plurality of openings 162 (including an individually identified first opening 162a and a second opening 162b) positioned over corresponding ones of the rings 150. More specifically, in some embodiments each of the openings 162 can be positioned over a corresponding one of the via portions 152 of the rings 150. For example, in the illustrated embodiment the first opening 162a is positioned over a portion of the first via portion 152a and the second opening 162b is positioned over a portion of the second via portion 152b. The openings 162 can be at least partially superimposed over corresponding ones of the second conductive features 126. For example, the first opening 162a is superimposed (e.g., aligned vertically) over the first one of the second conductive features 126b and the second opening 162b is superimposed over the second one of the second conductive features 126b. In some embodiments, the openings 162 can have a dimension (e.g., a width W shown in FIG. 2E) that is larger than the thickness T (FIG. 2C) of the non-conductive liner 136 such that a portion of the fourth insulative layer 118 and/or a portion of the fifth insulative material 140 is exposed in each of the openings 162. In other embodiments, the openings 162 can have different dimensions and/or can be positioned differently with respect to the rings 150. For example, one or more than two of the openings 162 can be positioned over each of the rings 150, the openings 162 can have different sizes and/or shapes from one another, and so on.

Figure 1F:
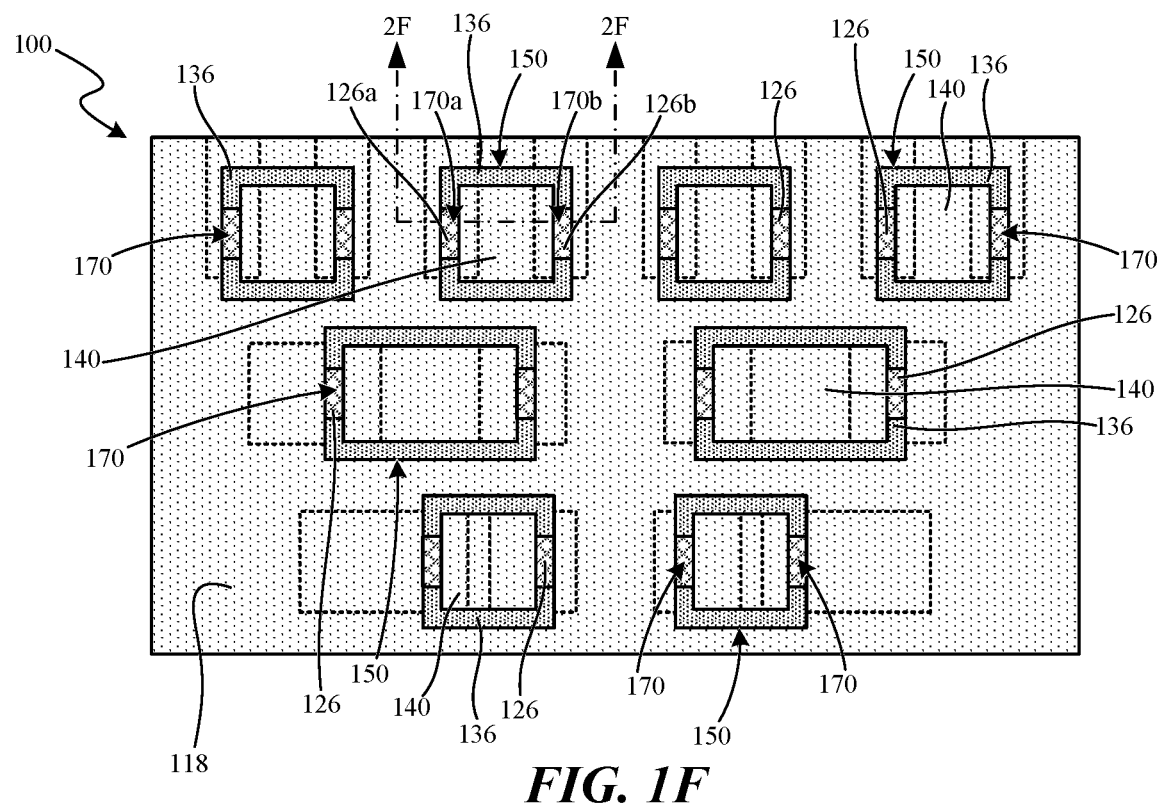
Figure 2F:
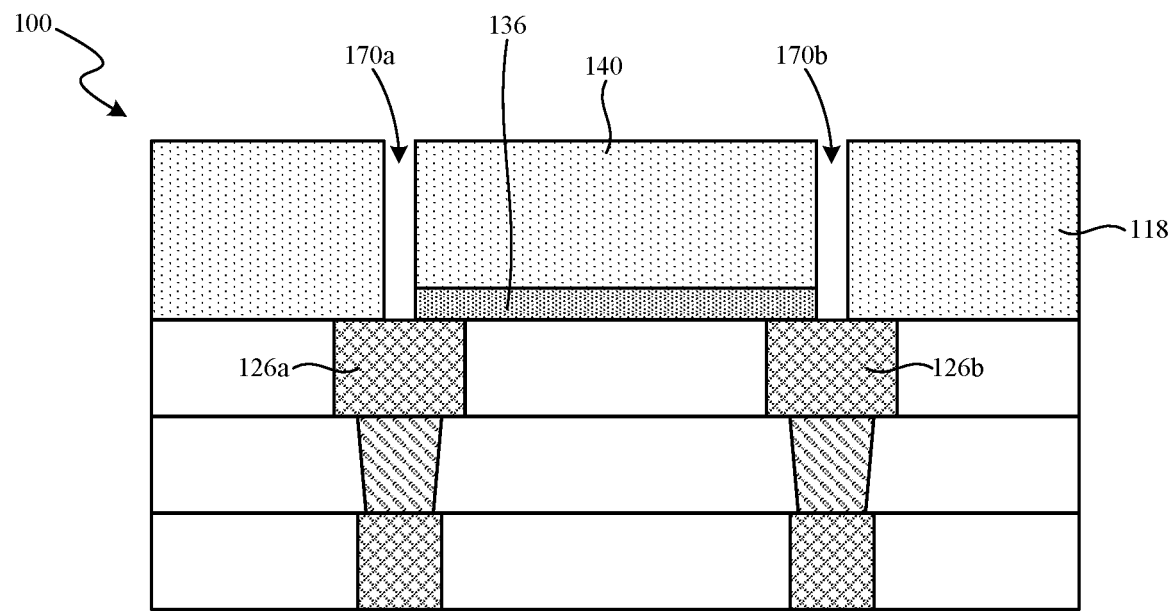

FIGS. 1F and 2F illustrate the semiconductor device 100 after (i) removing the non-conductive liner 136 positioned beneath the openings 162 in the mask 160 (FIGS. 1E and 2E) and (ii) removing the mask 160. In some embodiments, the non-conductive liner 136 can be removed using a suitable dry-etching process, wet-etching process, and/or other suitable material exhumation process that selectively removes only the non-conductive liner 136 exposed in the openings 162 without, for example, substantially removing any portion of the fourth insulative material 118 or the fifth insulative material 140 exposed in the openings 162. In the illustrated embodiment, after the removal process, the semiconductor device 100 includes openings 170 (e.g., slots, vias; including an individually identified first opening 170a and a second opening 170b) formed in the rings 150 (e.g., between the fourth insulative material 118 and the fifth insulative material 140) over corresponding ones of the second conductive features 126. For example, the first opening 170a is formed over the first one of the second conductive features 126a and the second opening 170b is formed over the second one of the second conductive features 126b. In some embodiments, the first opening 170a can be opposite to the second opening 170b along the ring 150. For example, in the illustrated embodiment the first opening 170a is formed in the first via portion 152a (FIG. 1E) and the second opening 170b is formed in the second via portion 152b (FIG. 1E) that is opposite to the first via portion 152a.

Figure 1G:
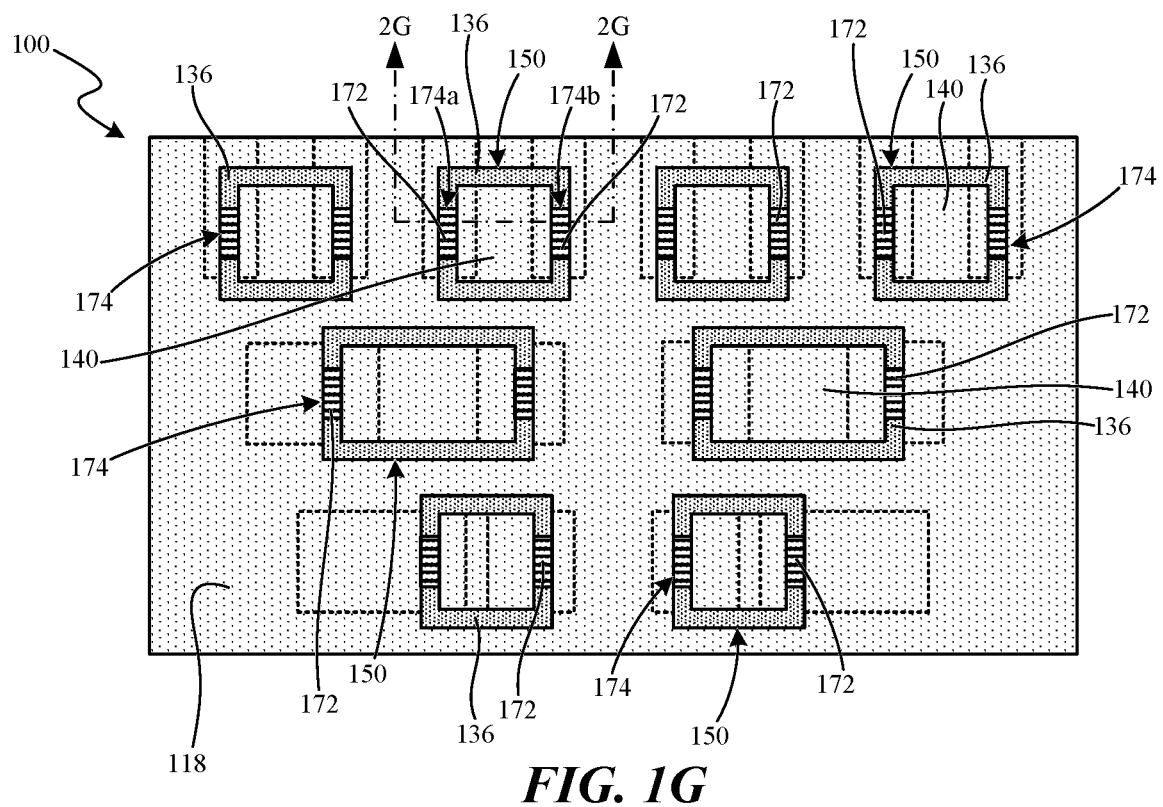
Figure 2G:
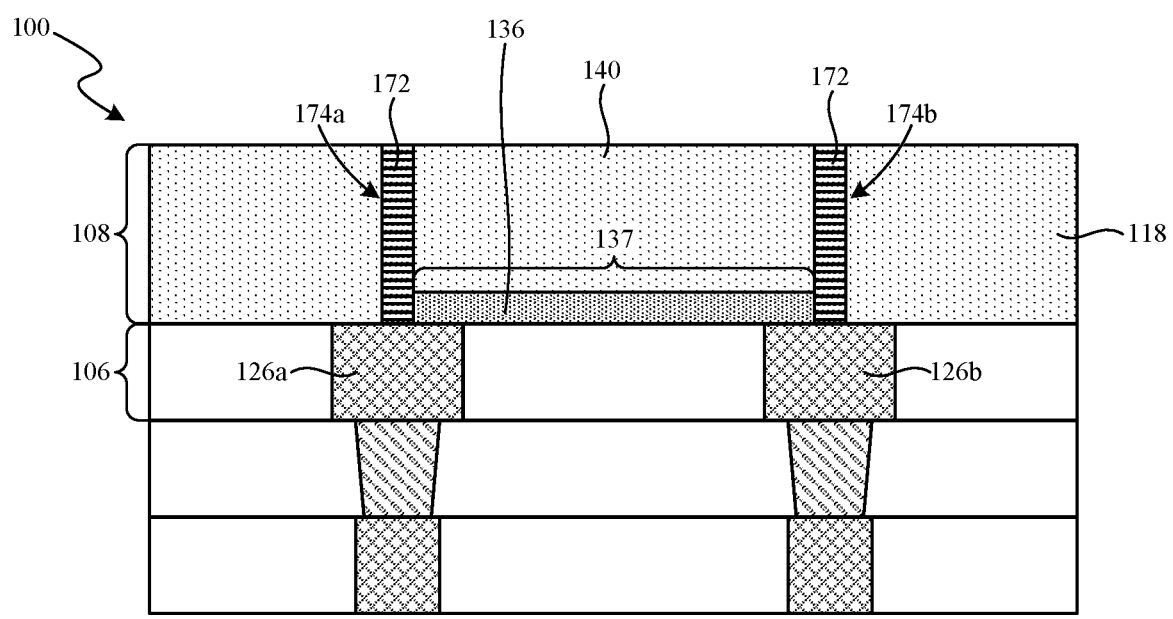

FIGS. 1G and 2G illustrate the semiconductor device 100 after forming/depositing a conductive material 172 in the openings 170 (FIGS. 1F and 2F) to form conductive vias 174 (including an individually identified first conductive via 174a and a second conductive via 174b) on the second conductive features 126. The conductive material 172 can comprise a metal such as tungsten, copper, silver, aluminum, a metal alloy, a conductive-metal containing material, or the like, and is electrically coupled to the portions of the second conductive features 126 exposed in the openings 170. In some embodiments, the conductive material 172 can be deposited via sputtering, chemical vapor deposition, physical vapor deposition, atomic layer deposition, spin coating, electroplating, electro-less plating, and/or another suitable deposition technique. In some embodiments, a seed material (not shown; e.g., titanium nitride (TiN)) can first be deposited in the openings 170 and then the conductive material 172 can be grown on the seed layer using, for example, a Birch reduction method.

In the illustrated embodiment, the conductive vias 174 are embedded in/along the rings 150 of the non-conductive liner 136. That is, the rings 150 and the conductive vias 174 can coextend, portions of the rings 150 can extend from/between the conductive vias 174, and so on. Moreover, the fourth insulative material 118 is positioned around/outside a perimeter defined by the rings 150 and the conductive vias 174. Further, in the illustrated embodiment the first horizontal portions 137 of the non-conductive liner 136 (FIG. 2G) remain over the third layer 106 and extend between the conductive vias 174. The conductive vias 174 are electrically separated by the non-conductive liner 136, the fourth insulative material 118, and/or the fifth insulative material 140.

In some embodiments, the semiconductor device 100 can be planarized after deposition of the conductive material 172. In some embodiments, a metallization layer (not shown) can subsequently be formed over the fourth layer 108. The metallization layer can include, for example, metal lines (e.g., word and/or bit lines) or other conductive features electrically coupled to corresponding ones of the conductive vias formed by the conductive material 172.

In some aspects of the present technology, the conductive vias 174 can be formed through the fourth layer 108 at a lower cost and/or with higher margin than conventional techniques for forming conductive vias. For example, with reference to FIGS. 1A-2G together, the openings 130 are significantly larger than the subsequently-formed conductive vias 174. That is, the aspect ratio of the openings 130 is less than the aspect ratio of the subsequently-formed conductive vias 174. Accordingly, the openings 130 can be formed with an etching or other process that is less precise—and thus more reliable and lower cost—than conventional methods that etch high aspect ratio holes that correspond to the subsequent dimensions of the conductive vias formed therein. Moreover, depositing the non-conductive liner 136 allows the openings 170—which correspond to the dimensions of the subsequently-formed conductive vias 174—to be formed using a selective-etching process that is more precise than if the openings 170 were directly formed in the fourth insulative material 118. In additional aspects of the present technology, the thickness T of the conductive vias 174 can be precisely controlled and made arbitrarily small via the deposition technique used to deposit the non-conductive liner 136.

In other embodiments, methods in accordance with the present technology can be used to form any number of conductive vias in an opening formed in an insulative material over conductive contacts or lines. For example, with continued reference to FIGS. 1A-2G together, the second one of the second conductive features 126b could be omitted from the third layer 106, and the fabrication process could proceed similarly to form the first opening 130a, deposit the non-conductive liner 136, and so on. However, with the second one of the second conductive features 126b omitted, only the first opening 170a need be formed in the non-conductive liner 136 and the second opening 170b could be omitted. Accordingly, the first conductive via 174a can be formed to have the same high aspect ratio and with the same advantages as described above without requiring the simultaneous formation of a conductive via over an adjacent or nearby one of the second conductive features 126, such as the second one of the second conductive features 126b.

Similarly, one or more of the openings 130 can be formed in the fourth insulative material 118 over more than two of the second conductive features 126 exposed in the openings 130. In some such embodiments, one or both of the connecting portions 154 of the rings 150 can be formed over a corresponding one or more of the second conductive features 126 exposed in the opening 130. Then, the openings 170 in the non-conductive liner 136 can be selectively formed in the via portions 152 and/or the connecting portions 154 and the conductive material 172 deposited therein to form the conductive vias 174 based on the arrangement of the underlying second conductive features 126.

Figure 3A:
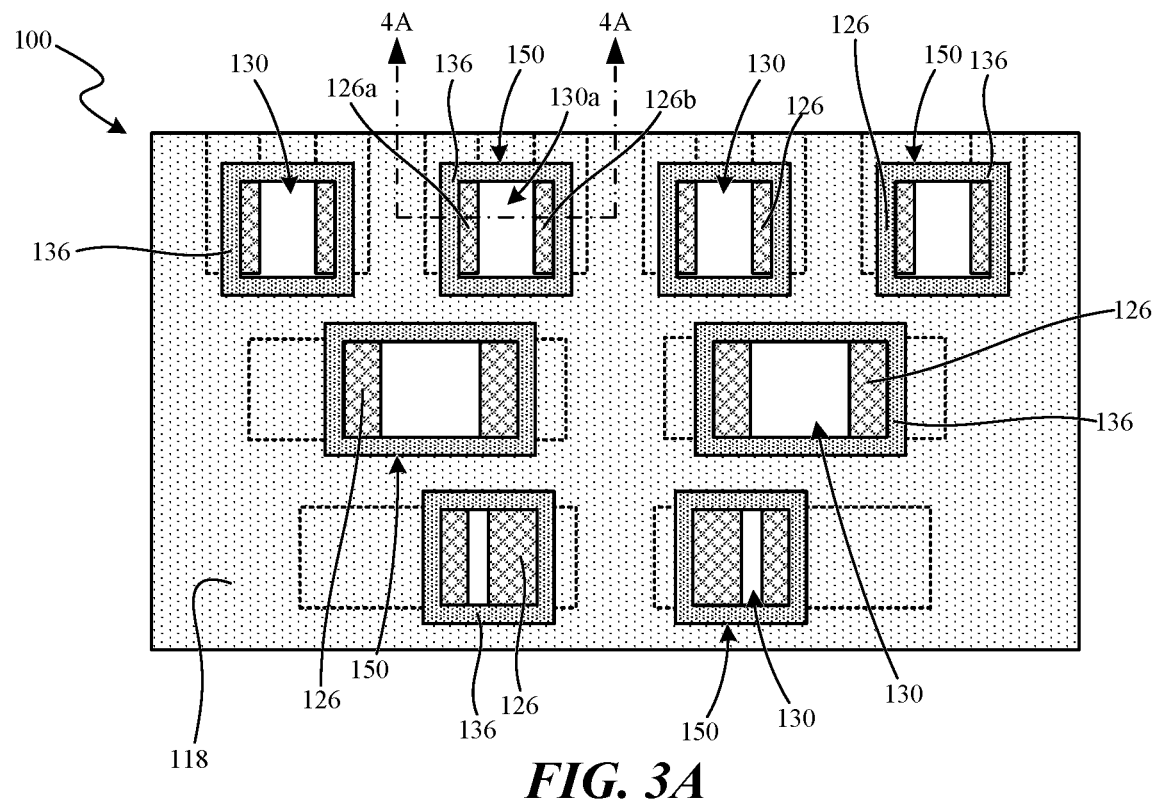
FIGS. 3A-3C are enlarged partially-schematic top views illustrating various stages in a method of manufacturing a semiconductor device in accordance with additional embodiments of the present technology.
Figure 4A:
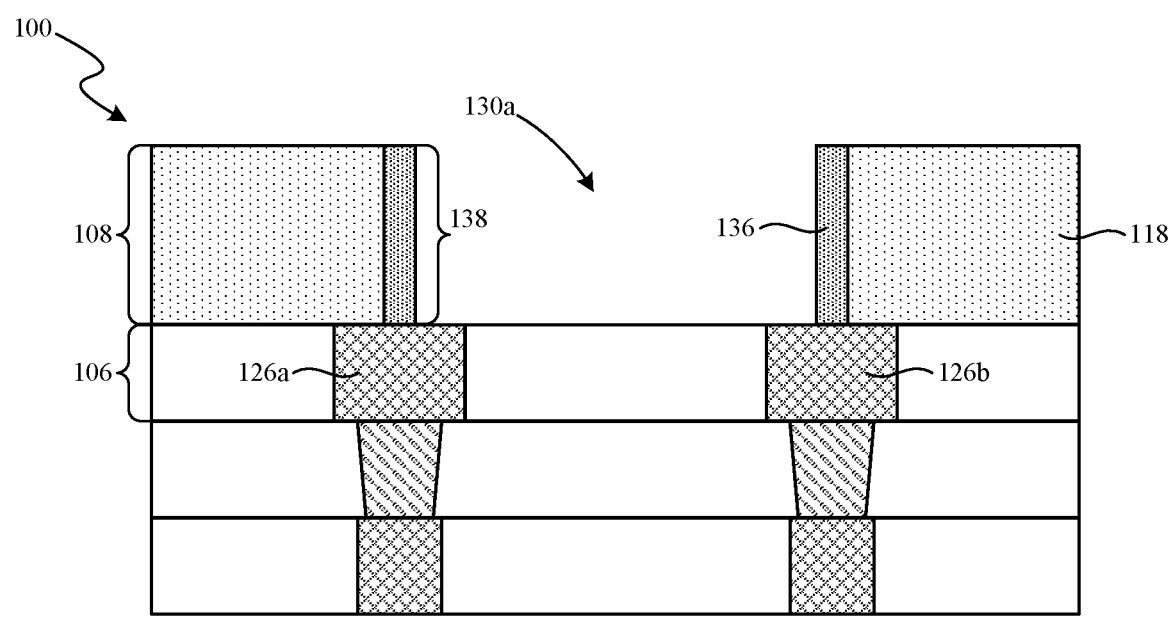
FIGS. 4A-4C are enlarged side cross-sectional views of the semiconductor device of FIGS. 3A-3C taken along the lines 4A-4A through 4C-4C shown in FIGS. 3A-3C, respectively, in accordance with embodiments of the present technology.
Figure 3B:
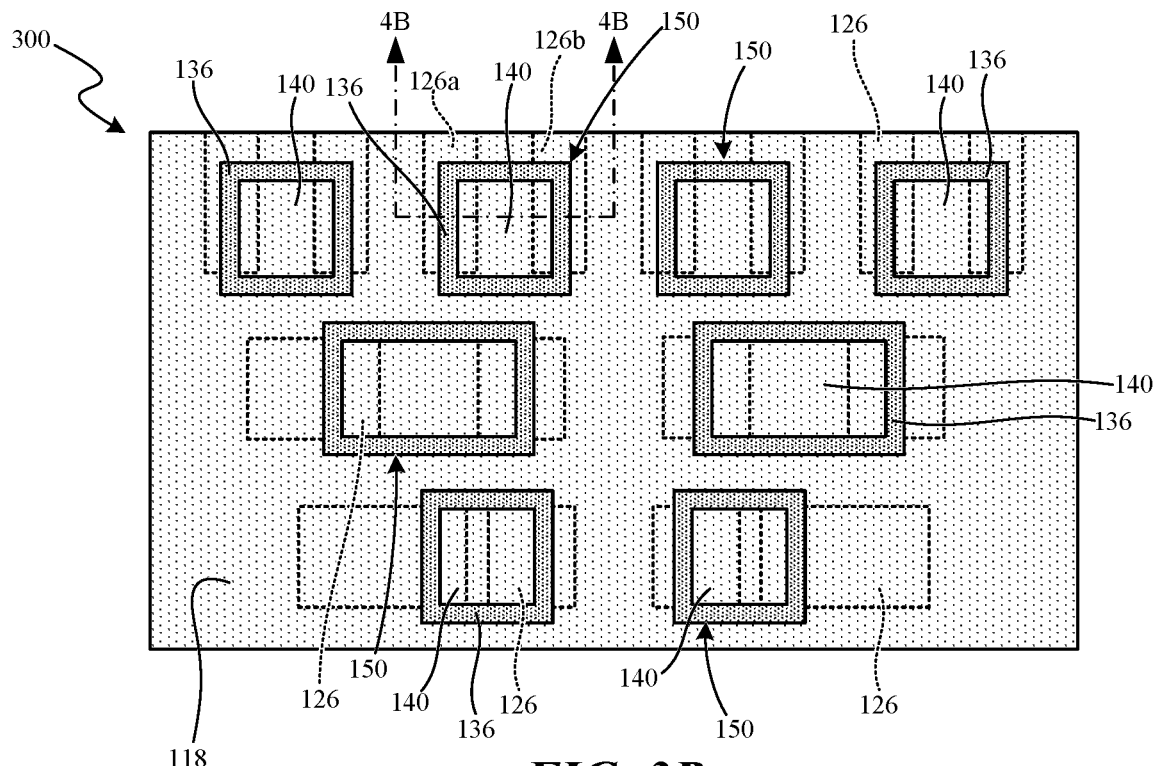
Figure 4B:
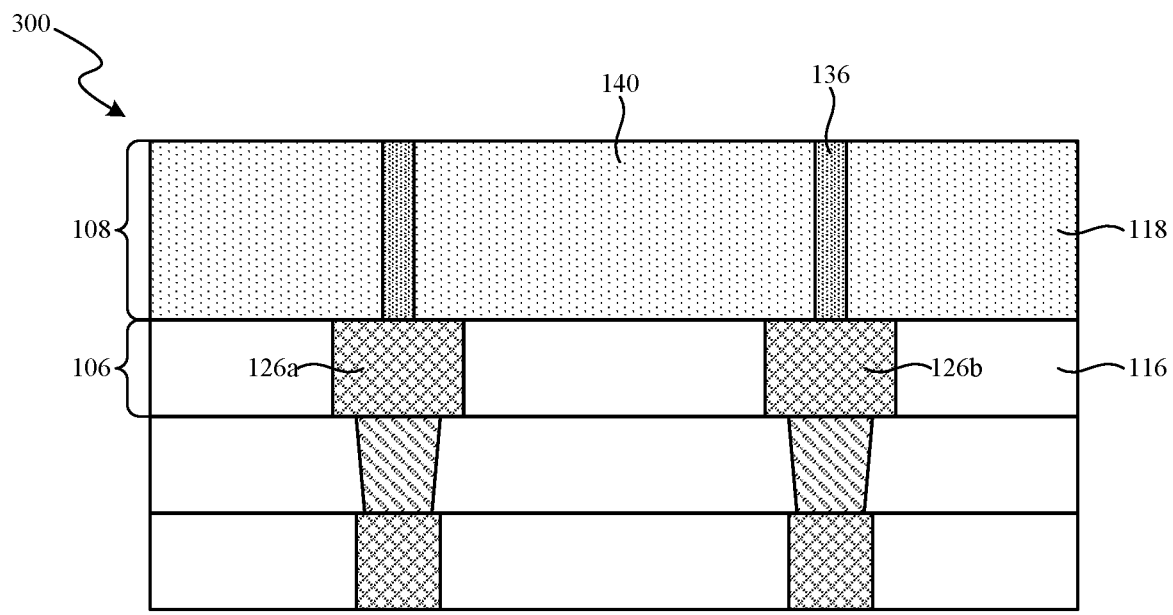
Figure 3C:
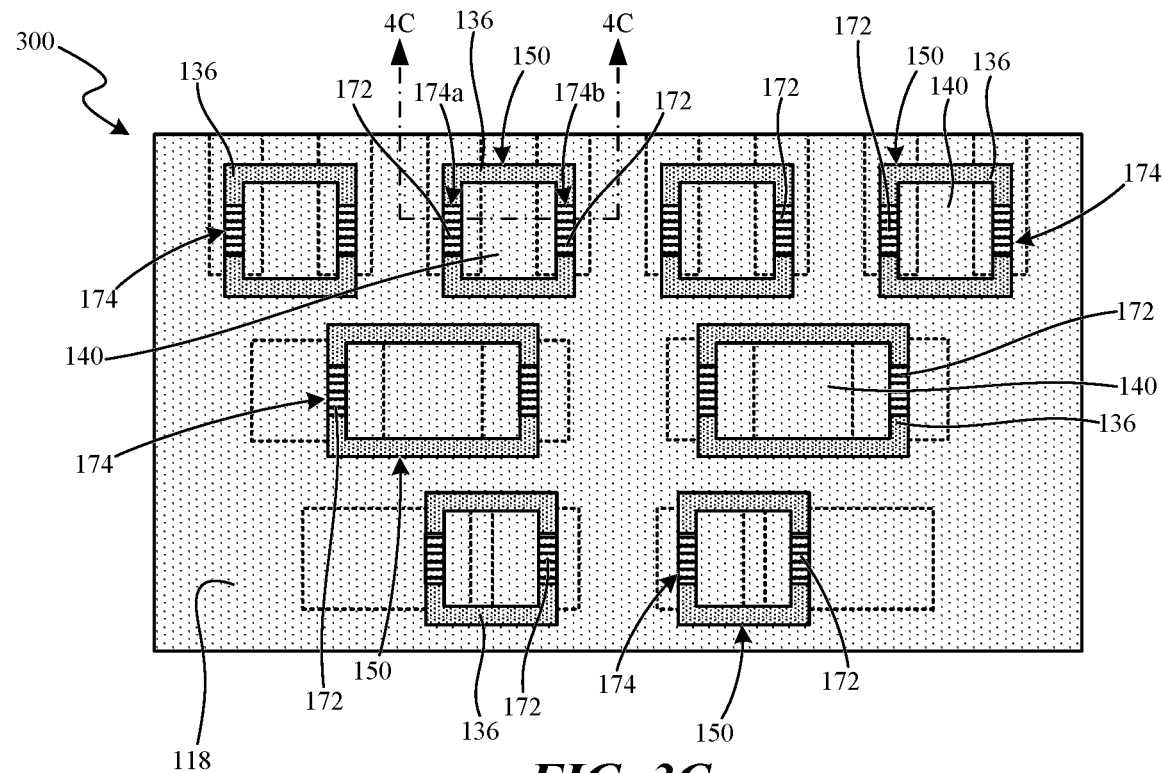
Figure 4C:
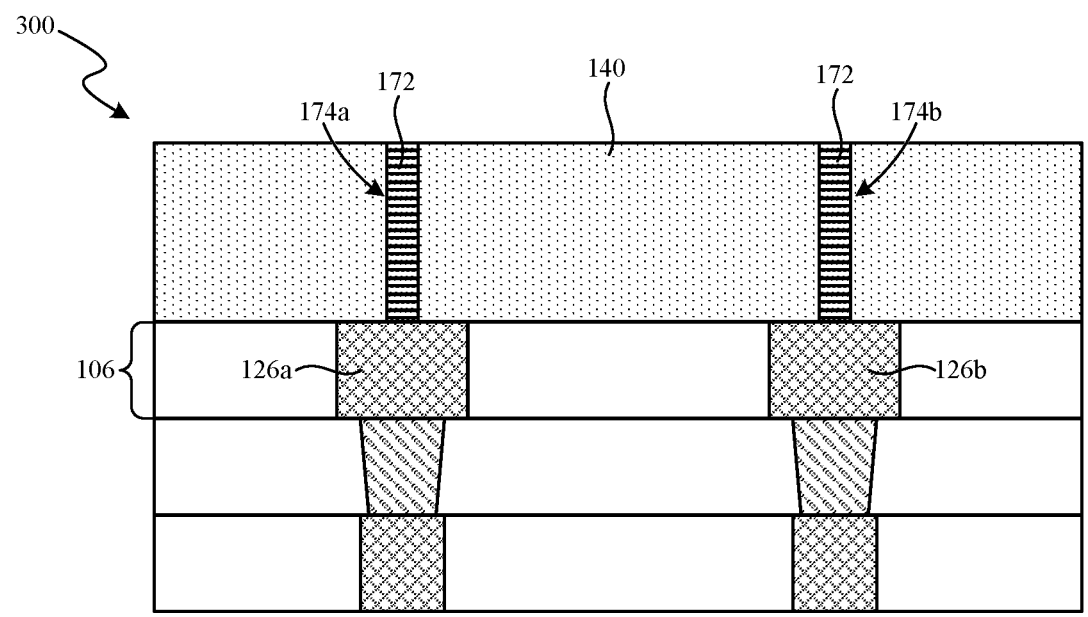

FIGS. 3A-3C are enlarged partially-schematic top views illustrating various stages in a method of manufacturing a semiconductor device 300 (e.g., a memory device) in accordance with additional embodiments of the present technology. FIGS. 4A-4C are enlarged side cross-sectional views of the semiconductor device 100 taken along the lines 4A-4A through 4C-4C shown in FIGS. 3A-3C, respectively, in accordance with embodiments of the present technology. Generally, the semiconductor device 300 can be manufactured in a similar manner and to include similar components as the semiconductor device 100 described in detail above with reference to FIGS. 1A-2G. For example, in some embodiments manufacturing of the semiconductor device 300 can proceed identically up to the stage of the semiconductor device 100 shown in FIGS. 1C and 2C.

However, as shown in FIGS. 3A and 4A, after depositing the non-conductive liner 136 over the third layer 106, the method can include removing the first and second horizontal portions 137, 139 (FIG. 2C) of the non-conductive liner 136 while leaving the vertical portions 138 of the non-conductive liner 136. In some embodiments, a photolithography, punching, plasma etching, wet etching, and/or other suitable process can be used to remove the first and second horizontal portions 137, 139. In some embodiments, the first and second horizontal portions 137, 139 can be removed using a straight punch process. As best seen in FIG. 4A, after removing the first and second horizontal portions 137, 139, the vertical portions 138 of the non-conductive liner 136 form/define the plurality of rings 150 within the corresponding ones of the openings 130. And, with the first horizontal portions 137 removed, the second conductive features 126 can be partially exposed within the openings 130. For example, the first and second ones of the second conductive features 126a-b are exposed within the first opening 130a.

FIGS. 3A and 4A further illustrate the semiconductor device 300 after planarization of the upper surface of the semiconductor device 300 (e.g., defined by the non-conductive liner 136 and/or the fourth insulative material 118). The planarization can ensure that the vertical portions 138 extend away from the third layer 106 to the same or substantially the same height as the fourth insulative material 118. In some embodiments, the planarization step can be omitted, can be incorporated into the removal process used to remove the first and second horizontal portions 137, 139 of the non-conductive liner 136, or can be implemented at a later manufacturing stage (e.g., after the stage described in detail below with reference to FIGS. 3B and 4B).

FIGS. 3B and 4B illustrate the semiconductor device 300 after depositing the fifth insulative material 140 in the openings 130 (FIGS. 3A and 4A) over the third layer 106 between the rings 150. In contrast to the semiconductor device 100 described in detail above, as best seen in FIG. 4B, the fifth insulative material 140 can directly contact the third layer 106—including the second conductive features 126 and the third insulative material 116.

FIGS. 3C and 4C illustrate the semiconductor device 300 after (i) selectively removing portions of the rings 150 and then (ii) forming the conductive vias 174 in the removed portions of the rings 150 over and electrically connected to corresponding ones of the second conductive features 126. These stages can proceed generally similarly or identically to the manufacturing stages described in detail above with reference to FIGS. 1E-2G including, for example, (i) forming a mask over the upper surface of the semiconductor device 300, (ii) removing the non-conductive liner 136 positioned beneath openings in the mask, (iii) removing the mask, and (iv) forming/depositing the conductive material 172 to form the conductive vias 174 where the non-conductive liner 136 was selectively removed. In contrast to the semiconductor device 100 described in detail above with reference to FIGS. 1A-2G, the fifth insulative material 140—rather than the first horizontal portion 137 of the non-conductive liner 136 (FIG. 2G)—directly contacts the third layer 106 in the center of the rings 150 and between adjacent ones of the conductive vias 174.

Figure 5:
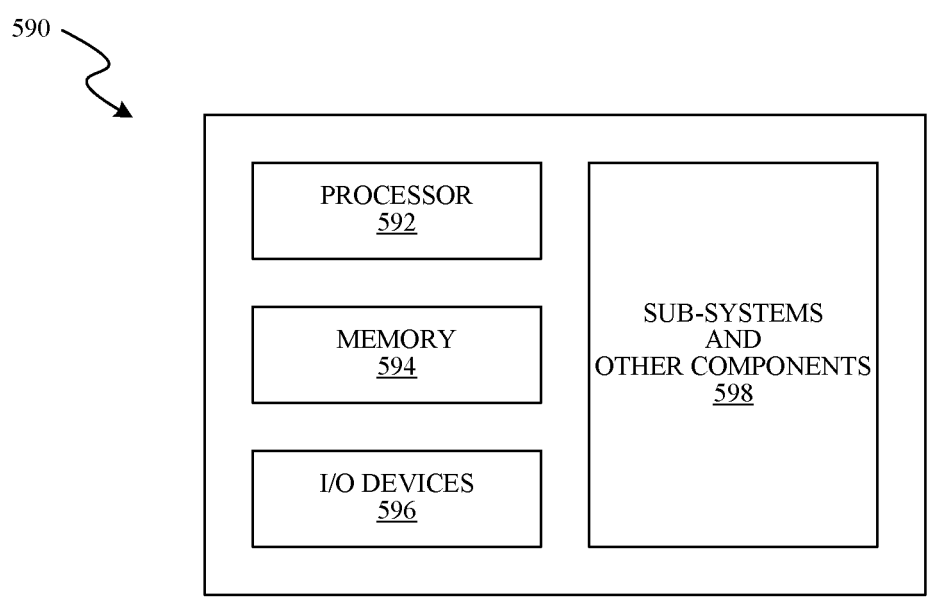
FIG. 5 is a schematic view of a system that includes a semiconductor device in accordance with embodiments of the present technology.

The semiconductor device 100 described in detail above with reference to FIGS. 1A-4C and/or packages incorporating the semiconductor device 100 and/or the semiconductor device 300 can be incorporated into any of a myriad of larger and/or more complex systems, a representative example of which is system 590 shown schematically in FIG. 5. The system 590 can include a processor 592, a memory 594 (e.g., SRAM, DRAM, flash, and/or other memory devices), input/output devices 596, and/or other subsystems or components 598. The memory devices and/or packages described above with reference to FIGS. 1A-4C can be included in any of the elements shown in FIG. 5. The resulting system 590 can be configured to perform any of a wide variety of suitable computing, processing, storage, sensing, imaging, and/or other functions. Accordingly, representative examples of the system 590 include, without limitation, computers and/or other data processors, such as desktop computers, laptop computers, Internet appliances, hand-held devices (e.g., palm-top computers, wearable computers, cellular or mobile phones, personal digital assistants, music players, and so on), tablets, multi-processor systems, processor-based or programmable consumer electronics, network computers, and minicomputers. Additional representative examples of the system 590 include lights, cameras, vehicles, etc. With regard to these and other example, the system 590 can be housed in a single unit or distributed over multiple interconnected units, for example, through a communication network. The components of the system 590 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A method of manufacturing a semiconductor device, the method comprising:
    removing a portion of an insulative material to define an opening at least partially over an electrically conductive feature, wherein the insulative material includes a sidewall at least partially defining the opening;
    forming a layer of electrically non-conductive material at least partially covering the sidewall;
    removing a portion of the layer of electrically non-conductive material to form an opening over the electrically conductive feature; and
    depositing an electrically conductive material into the opening in the layer of electrically non-conductive material to form a conductive via electrically coupled to the electrically conductive feature.

2. The method of claim 1 wherein removing the portion of the layer of electrically non-conductive material includes:
    forming a mask over the insulative material and the layer of electrically non-conductive material such that the mask includes an opening over the portion of the layer of electrically non-conductive material; and
    etching the portion of the of the layer of electrically non-conductive material exposed in the opening in the mask.

3. The method of claim 2 wherein the forming the mask further includes forming the mask such that the opening in the mask is positioned over a portion of the insulative material, and wherein etching the portion of the layer of electrically non-conductive material includes selectively etching the portion of the layer of electrically non-conductive material exposed in the opening while not etching the insulative material exposed in the opening.

4. The method of claim 1 wherein the insulative material is a first insulative material, wherein the electrically conductive feature is positioned in a layer of a second insulative material, and wherein forming the layer of electrically non-conductive material includes depositing the electrically non-conductive material in the opening over (a) the sidewall of the first insulative material and (b) the layer of the second insulative material.

5. The method of claim 4 wherein the method further includes removing the electrically non-conductive material from over the layer of the second insulative material before removing the portion of the layer of electrically non-conductive material.

6. The method of claim 1 wherein forming the layer of electrically non-conductive material includes forming the layer of electrically non-conductive material to have a generally rectilinear cross-sectional shape.

7. The method of claim 1 wherein the insulative material is a first insulative material, and wherein the method further comprises depositing a second insulative material into the opening after forming the layer of electrically non-conductive material in the opening.

8. The method of claim 1 wherein the insulative material and the electrically non-conductive material are different.

9. The method of claim 1 wherein the electrically conductive feature is a conductive line extending through an insulative material and electrically coupled to a memory element.

10. A method of manufacturing a semiconductor device, the method comprising:
   removing a portion of an insulative material to define an opening at least partially over a first electrically conductive feature and a second electrically conductive feature, wherein the insulative material includes a sidewall at least partially defining the opening;
   forming a layer of electrically non-conductive material at least partially covering the sidewall;
   removing a first portion of the layer of electrically non-conductive material to form a first opening over the first electrically conductive feature;
   removing a second portion of the layer of electrically non-conductive material to form a second opening over the second electrically conductive feature;
   depositing an electrically conductive material into the first opening to form a first conductive via electrically coupled to the first electrically conductive feature; and
   depositing the electrically conductive material into the second opening to form a second conductive via electrically coupled to the second electrically conductive feature.

11. The method of claim 10 wherein the first portion of the layer of electrically non-conductive material is opposite the second portion of the layer of electrically non-conductive material.

12. The method of claim 10 wherein forming the layer of electrically non-conductive material includes forming the layer of electrically non-conductive material to have a generally rectilinear cross-sectional shape having opposing first sides and opposing second sides.

13. The method of claim 12 wherein the first portion of the layer of electrically non-conductive material is a portion of one of the first sides, and wherein the second portion of the layer of electrically non-conductive material is a portion of the other one of the first sides.

14. The method of claim 10 wherein the insulative material is a first insulative material, and wherein forming the layer of electrically non-conductive material includes:
   depositing the electrically non-conductive material in the opening over (a) the sidewall and (b) a second insulative layer having the first and second electrically conductive features therein; and
   removing the electrically non-conductive material from over the insulative layer.

* * * * *